(12) United States Patent
Fifield

(10) Patent No.: US 7,130,670 B2
(45) Date of Patent: Oct. 31, 2006

(54) WIRELESS NETWORK CARD WITH ANTENNA SELECTION OPTION

(75) Inventor: David Fifield, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 606 days.

(21) Appl. No.: 10/271,655

(22) Filed: Oct. 15, 2002

(65) Prior Publication Data

US 2003/0092396 A1 May 15, 2003

Related U.S. Application Data

(60) Provisional application No. 60/348,859, filed on Nov. 9, 2001.

(51) Int. Cl.
*H04M 1/00* (2006.01)

(52) U.S. Cl. ............... 455/575.7; 455/129; 455/575.1; 455/90.1; 174/260; 174/261; 439/49; 439/217; 439/218; 439/43

(58) Field of Classification Search ............ 455/554.2, 455/558, 562.1, 575.1, 82, 83, 575.7; 343/713, 343/711, 700, 702, 770, 767, 906, 904; 174/260, 174/261

See application file for complete search history.

(56) References Cited

U.S. PATENT DOCUMENTS

| 5,649,224 | A | * | 7/1997 | Scheer | 710/300 |
| 5,999,294 | A | * | 12/1999 | Petsko | 398/115 |
| 6,396,447 | B1 | * | 5/2002 | Jonasson | 343/713 |
| 2004/0225786 | A1 | * | 11/2004 | Puupponen et al. | 710/240 |

* cited by examiner

*Primary Examiner*—George Eng
*Assistant Examiner*—Nam Huynh
(74) *Attorney, Agent, or Firm*—Garlick Harrison & Markison; Bruce Garlick; Kevin L. Smith

(57) ABSTRACT

A wireless network card includes an adaptable antenna connection structure that includes connections for one or more internal antennas and for one or more Radio Frequency (RF) connectors that may be coupled to one or more external antennas. A Printed Circuit Board (PCB) and electronic components located thereon form the wireless network card. The PCB includes a removable portion that, when removed, leaves an opening that receives an RF antenna connector. When the PCB is used to create a client wireless network card, one or more surface mount antennas are mounted on the PCB and coupled to surface mount antenna conductive pads formed thereon. The wireless network card may include (1) the surface mount antenna; (2) the RF connector; or (3) both the surface mount antenna and the RF connector.

28 Claims, 10 Drawing Sheets

WIRELESS NETWORK CARD WITH ANTENNA SELECTION OPTION

CROSS REFERENCE TO RELATED APPLICATION

This application claims priority to U.S. Provisional Application Ser. No 60/348,859, filed Nov. 9, 2001, the disclosure of which is incorporated herein by reference.

FIELD OF THE INVENTION

This invention relates generally to printed circuit boards; and more particularly to printed circuit boards used in wireless network devices.

BACKGROUND OF THE INVENTION

Communication technologies that wirelessly link electronic devices are well known in the art. In most wireless systems, wireless devices operate in cooperation with one another to form a wireless network. These wireless devices may be compliant with one or more operating standards, e.g., IEEE 802.11a, IEEE 802.11b, IEEE 802.11g, Bluetooth, etc. Some of these wireless networks, e.g., those that operate according to one portion of IEEE 802.11, include at least one Wireless Access Points (WAP) that services a plurality of wireless clients. Wireless clients may include desktop computers, laptop computers, printers, personal data assistants, and other electronic devices.

Each wireless device of the wireless network typically includes a wireless network card that facilitates the wireless communications. A wireless network card typically includes a Printed Circuit Board (PCB) and components contained thereon. As is generally known, the PCB serves as a mounting surface for the components and provides device interconnection conductors, shielding, etc. The wireless network card may be a PCI card, a PCMCIA card, or another card that is added to a corresponding wireless device. Components placed on the PCB include host interface circuitry, baseband-processing circuitry that implements communication protocol operations, Radio Frequency (RF) circuitry, and at least one antenna. The electronics of the wireless network card may be formed in a single integrated circuit or in multiple integrated circuits.

Each wireless network card has its respective operational requirements. For example, WAP wireless network cards must have greater transmit power and greater receive gain than do client wireless network cards. Thus, while client wireless network cards often times employ internal antennas that locate on the surface of the corresponding PCB, WAP wireless network cards typically employ external antennas having relatively larger antenna gains.

The components of the WAP wireless network cards and the client wireless network cards are typically otherwise very similar or identical. Thus, to support different antenna structures, WAP wireless network cards and client wireless access cards require differing PCB structures. While PCBs manufactured for WAP wireless network cards must include external antenna connections, PCBs manufactured for client wireless network cards must include internal (surface mount) antenna connections. Further still, a third type of wireless network card used for lab testing purposes is required to have both internal antenna connections and external antenna connections. Thus, three different PCB designs must be manufactured to service these purposes, even though they may contain the same/similar electronic components.

Thus, there is a need in the art for a wireless network card structure that may be used for client devices and WAPs. Further, a need exists for a wireless network card structure that may be used for client devices, WAPs, and for lab testing purposes.

SUMMARY OF THE INVENTION

In order to overcome the above-cited shortcomings of the prior devices, among other shortcomings, a wireless network card constructed according to the present invention includes an adaptable antenna connection structure that includes connections for one or more internal antennas and for one or more Radio Frequency (RF) connectors that may be coupled to one or more external antennas. In one embodiment, a Printed Circuit Board (PCB) and electronic components located thereon form the wireless network card. The PCB includes a removable portion that, when removed, leaves an opening that receives an RF antenna connector such as a coaxial or another connector. When the PCB is used to create a client wireless network card, one or more surface mount antennas are mounted on the PCB and coupled to surface mount antenna conductive pads formed thereon. When the PCB is used to create a WAP wireless network card, the removable portion is removed and an RF antenna connector is inserted in the opening previously occupied by the removable portion. Then, the RF antenna connector is electrically coupled to one or more conductive pads located on the PCB. When the PCB is used to create a wireless network card for testing purposes, both the RF antenna connector(s) and the surface mount antenna(s) are constructed on the PCB.

An important aspect of the present invention relates to the manner in which the removable portion is formed. Conductive pads residing adjacent the removable portion are joined by a conductor that is formed in/on the removable portion. With the removable portion in place, the conductor (controlled impedance transmission line) joins the conductive pads that reside adjacent the removable portion. With this connection in place, a circuit is formed between a surface mount antenna conductive pad that will later couple to an RF circuitry mounted upon the PCB and one of the conductive pads residing adjacent the removable portion that will be later coupled to RF circuitry mounted on the PCB. With the removable portion removed, the conductor that previously joined the adjacent conductive pads is severed. Thus, the circuit that was previously formed between the surface mount antenna conductive pad and the conductive pad that will be later coupled to the RF circuitry is severed. However, a switched RF antenna connector that is placed in the opening may be coupled to the adjacent conductive pads to reform the circuit.

In one embodiment of the present invention, the PCB is constructed to receive a single internal antenna and/or a single RF antenna connector that is later coupled to an external antenna. In another embodiment, the PCB is constructed to receive a pair of internal antennas and/or a pair of RF antenna connectors that are later coupled to a pair of external antennas. With the second embodiment, RF circuitry coupled to the pair of internal antennas and/or the pair of external antennas employ antenna diversity operations. Further, with the second embodiment, two removable portions are formed on the PCB that may be removed to form two openings.

Other features and advantages of the present invention will become apparent from the following detailed description of the invention made with reference to the accompanying drawings.

BRIEF DESCRIPTION OF THE DRAWINGS

These and other features, aspects and advantages of the present invention will be more fully understood when considered with respect to the following detailed description, appended claims and accompanying drawings wherein:

DETAILED DESCRIPTION OF THE INVENTION

Figure 1:
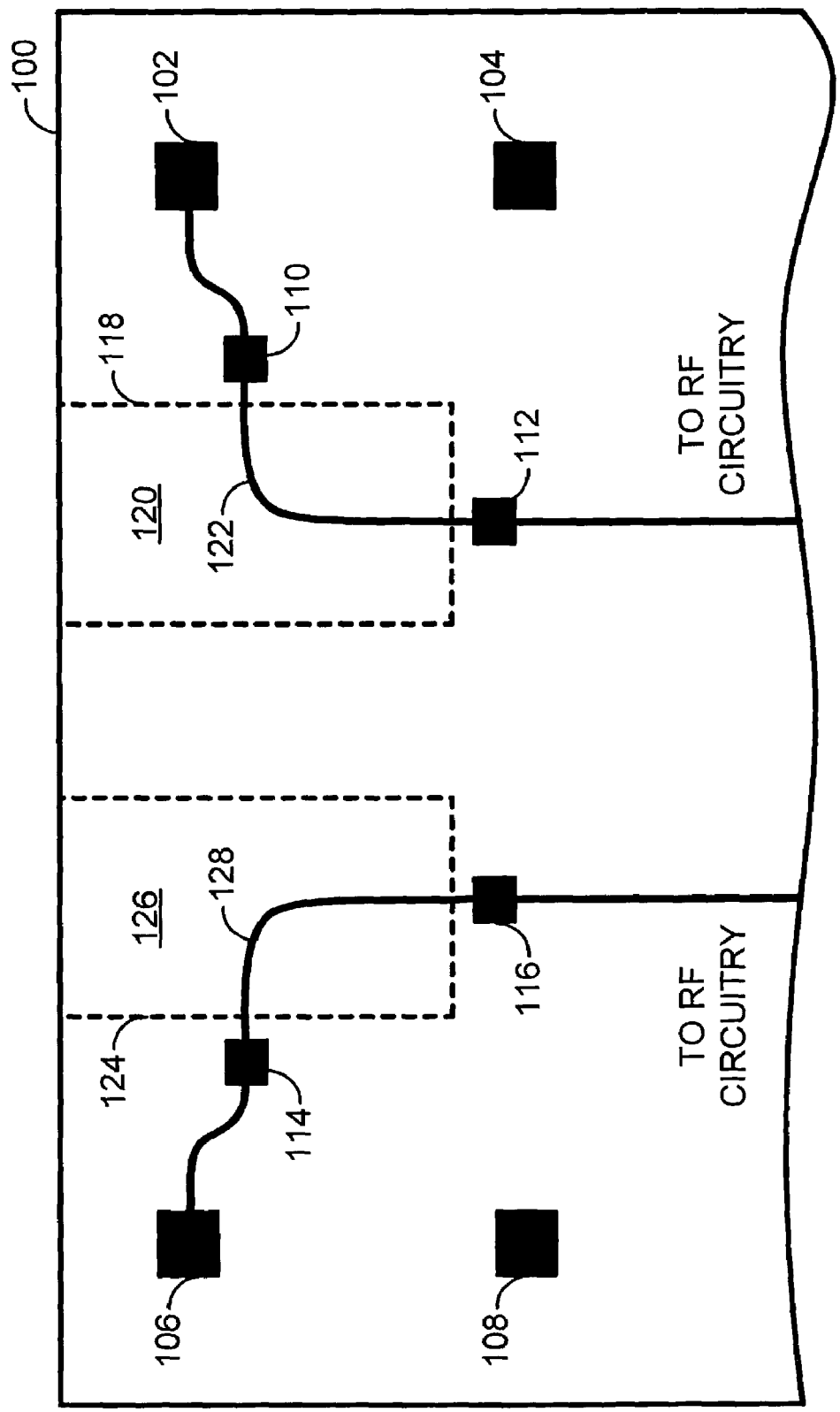
FIG. 1 is a partial diagrammatic view of a Printed Circuit Board (PCB) constructed according to the present invention.

FIG. 1 is a partial diagrammatic view of a Printed Circuit Board (PCB) constructed according to the present invention. The PCB 100 is formed using conventional techniques and includes a plurality of dielectric layers. Formed upon each dielectric layer within various layers of the PCB 100 are conductive traces and-conductive grids. The conductive traces are used to interconnect integrated circuits mounted on the PCB 100. The conductive grids are used for shielding purposes. The integrated circuits mounted on the PCB 100 may be surface mount devices or through hole mounted devices. The structure of conventional PCBs is generally known and will not be further described herein except as it relates to the present invention.

When manufactured, the PCB 100 includes connections for one or more internal antennas. In particular, surface mount antenna conductive pads 102 and 104 are disposed on PCB 100 to receive a first surface mount antenna while surface mount antenna conductive pads 106 and 108 are disposed on PCB 100 to receive a second surface mount antenna. The PCB 100 also includes removable portions 120 and 126 that, when removed, form openings to receive Radio Frequency (RF) antenna connectors such as coaxial or other connectors. First removable portion 120 is defined by boundary 118 while second removable portion 126 is defined by a boundary 124. These boundaries 118 and 124 may comprise perforations in the PCB 100 that extend substantially or fully through the PCB 100. These boundaries 118 and 124 may be formed via laser etching, drilling, or another technique that creates the perforations in the PCB 100. In another embodiment, these boundaries 118 and 124 are merely locations on the PCB through which no conductors other than conductors 122 and 128 traverse. In such case, the boundaries 118 and 124 serve as guidelines that define removable portions 120 and 128 and that may be removed using a saw, drill, laser or another tool to form openings defined by the boundaries 118 and 124.

When the PCB 100 is used to create a client wireless network card, one or more surface mount antennas are mounted on the PCB 100 and coupled to the surface mount antenna conductive pads 102 and 104 and/or 106 and 108. When the PCB 100 is used to create a WAP wireless network card, the removable portion(s) 120 or/and 126 is/are removed and RF antenna connector(s) is/are inserted in the opening(s) previously occupied by the removable portion(s) 120 or/and 126. Then, the RF antenna connectors placed therein are electrically coupled to RF circuitry that is mounted on the PCB 100.

Conductive pads 110 and 112 residing adjacent removable portion 120 are joined by a conductor (controlled impedance transmission line) 122 that is formed in/on the removable portion 120. Likewise, conductive pads 114 and 116 residing adjacent removable portion 126 are joined by a conductor (controlled impedance transmission line) 128 that is formed in/on the removable portion 126. With the removable portions in place, the conductors join the conductive pads adjacent the removable portion.

For example, with the removable portion 120 in place, conductor 122 electrically couples conductive pads 110 and 112. With this connection in place, a circuit may be formed between surface mount antenna conductive pad 102 and RF circuitry that is mounted on the PCB 100. With the removable portion 120 removed, the conductor 122 that previously joined the adjacent conductive pads 110 and 112 is severed. However, an RF antenna connector, which may be a switched RF antenna connector, is placed in the opening previously occupied by the removable portion 120 and couples the conductive pads 110 and 112 to reform the circuit.

Likewise, with the removable portion 126 in place, conductor 128 joins the conductive pads 114 and 116. With this connection in place, a circuit may be formed between surface mount antenna conductive pad 106 and RF circuitry that is mounted on the PCB 100. With the removable portion 126 removed, the conductor 128 that previously joined the adjacent conductive pads 114 and 116 is severed. However, an RF antenna connector, which may be a switched RF antenna connector, is placed in the opening previously occupied by the removable portion 126 and couples the conductive pads 114 and 116 to reform the circuit.

The conductive paths joining RF circuitry to the surface mount antenna conductive pads 102 and 106 must be formed so to satisfactorily carry RF signals coupled thereto by the RF circuitry in a transmission operation and received thereby by from the surface mount antenna in a receive operation. The conductive paths that include conductors 122 and 128 must have specified a surge impedance to minimize reflections, noise coupling, and unintended RF propagation, among other design goals. These considerations are generally known and are not described further herein except as they relate to the present invention.

Figure 2:
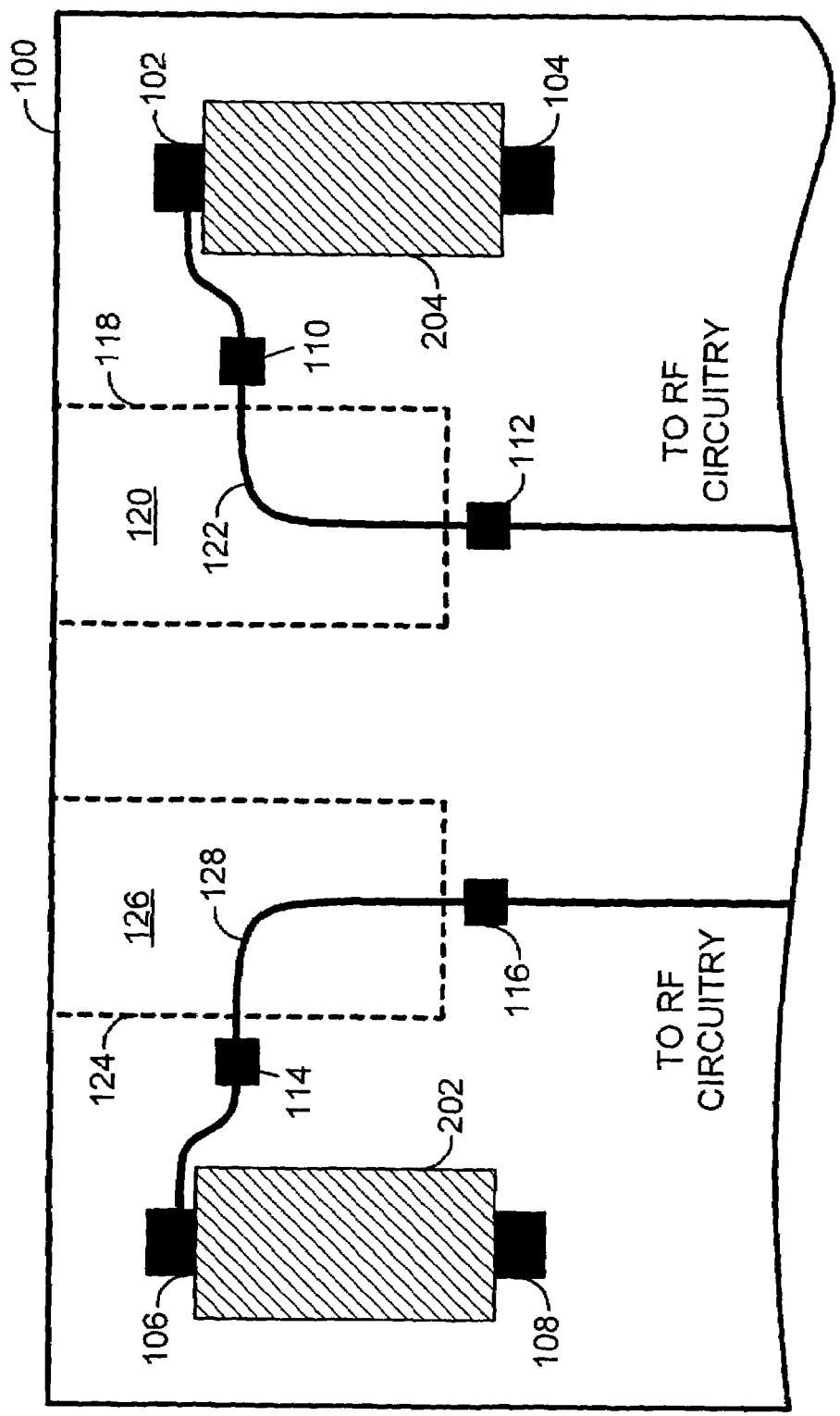
FIG. 2 is a partial diagrammatic view of the PCB of FIG. 1 with a pair of surface mount antennas mounted thereon according to the present invention.

FIG. 2 is a partial diagrammatic view of the PCB 100 of FIG. 1 with a pair of surface mount antennas mounted thereon according to the present invention. The surface mount antennas 202 and 204 may be strip antennas or other internally mounted antennas. As shown, first surface mount antenna 202 couples to surface mount antenna conductive pads 106 and 108. Likewise, second surface mount antenna 202 couples to surface mount antenna conductive pads 102 and 104. As is shown, the removable portions 120 and 126 are still in place. Thus, the controlled impedance transmission line 122 that resides upon removable portions 120 forms a portion of a circuit between RF circuitry (not shown) and antenna conductive pad 102. Likewise, the controlled impedance transmission line 128 that resides upon removable portions 126 forms a portion of a circuit between RF circuitry and antenna conductive pad 106.

Figure 3:
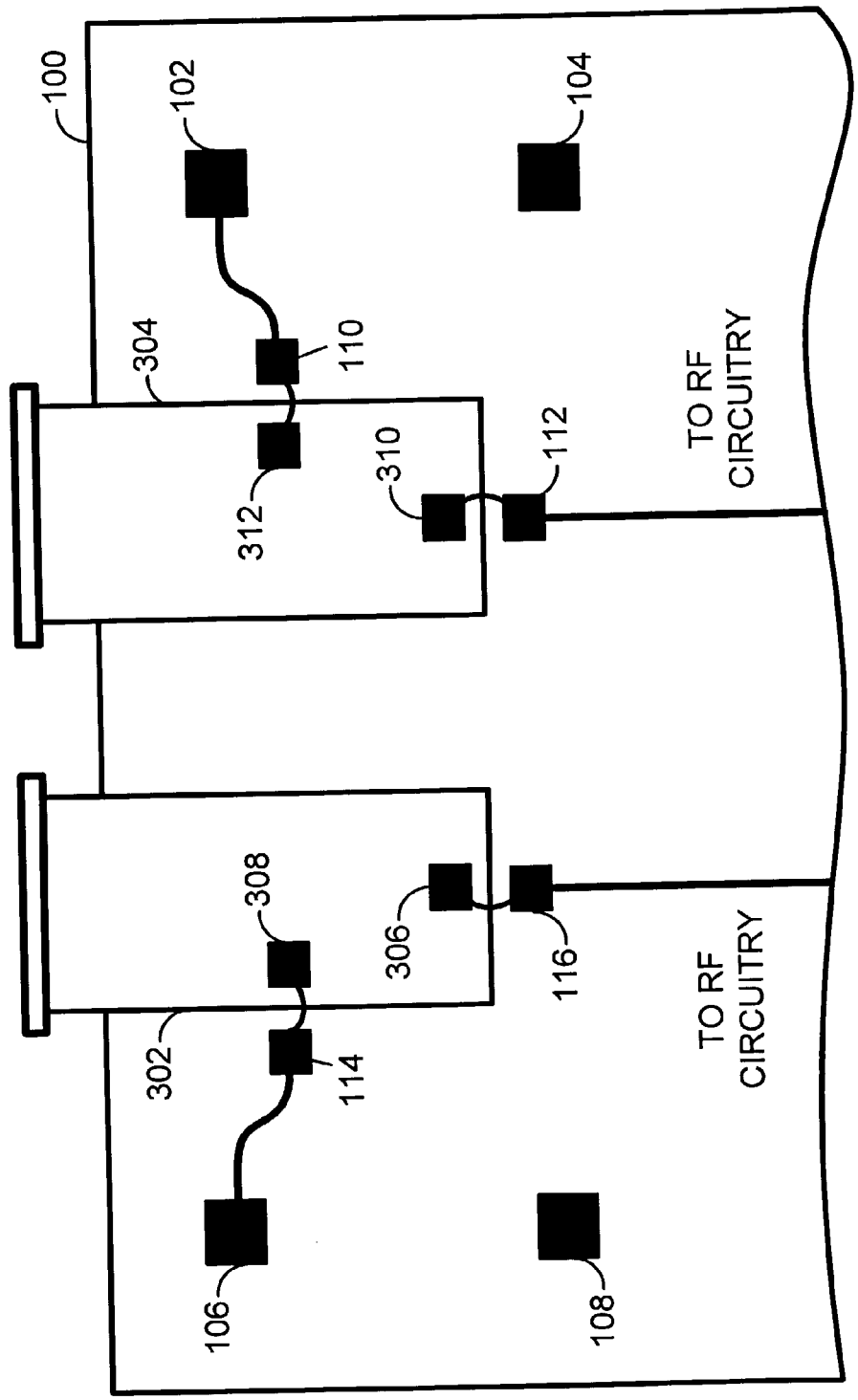
FIG. 3 is a partial diagrammatic view of the PCB of FIG. 1 with a pair of RF antenna connectors mounted thereon according to the present invention.

FIG. 3 is a partial diagrammatic view of the PCB of FIG. 1 with a pair of RF antenna connectors mounted thereon according to the present invention. As is shown, removable portions 120 and 126 have been removed to create openings in which RF antenna connectors are mounted. In particular, RF antenna connector 304 is mounted in an opening that removable portion 120 previously occupied. Likewise, RF antenna connector 302 is mounted in an opening previously occupied by removable portion 126. The RF antenna connectors 302 and 304 mounted on the PCB 100 are switched coaxial antenna connectors.

Upon removal of the removable portions 120 and 126, conductors 122 and 128 were severed. In the place of these conductors 122 and 128, connections are made with the RF antenna connectors 302 and 304. With reference to RF antenna connector 302, connector 306 is coupled to pad 116. Optionally, conductive pad 308 of the RF antenna connector 302 may be coupled to conductive pad 114. Likewise, with reference to RF antenna connector 304, connector 310 is coupled to pad 112 and connector 308 is optionally coupled to conductive pad 110. Coupling between the RF antenna connectors 302 and 304 and the pads on the PCB 110 is made to maintain impedance matching as best as is possible.

Figure 4:
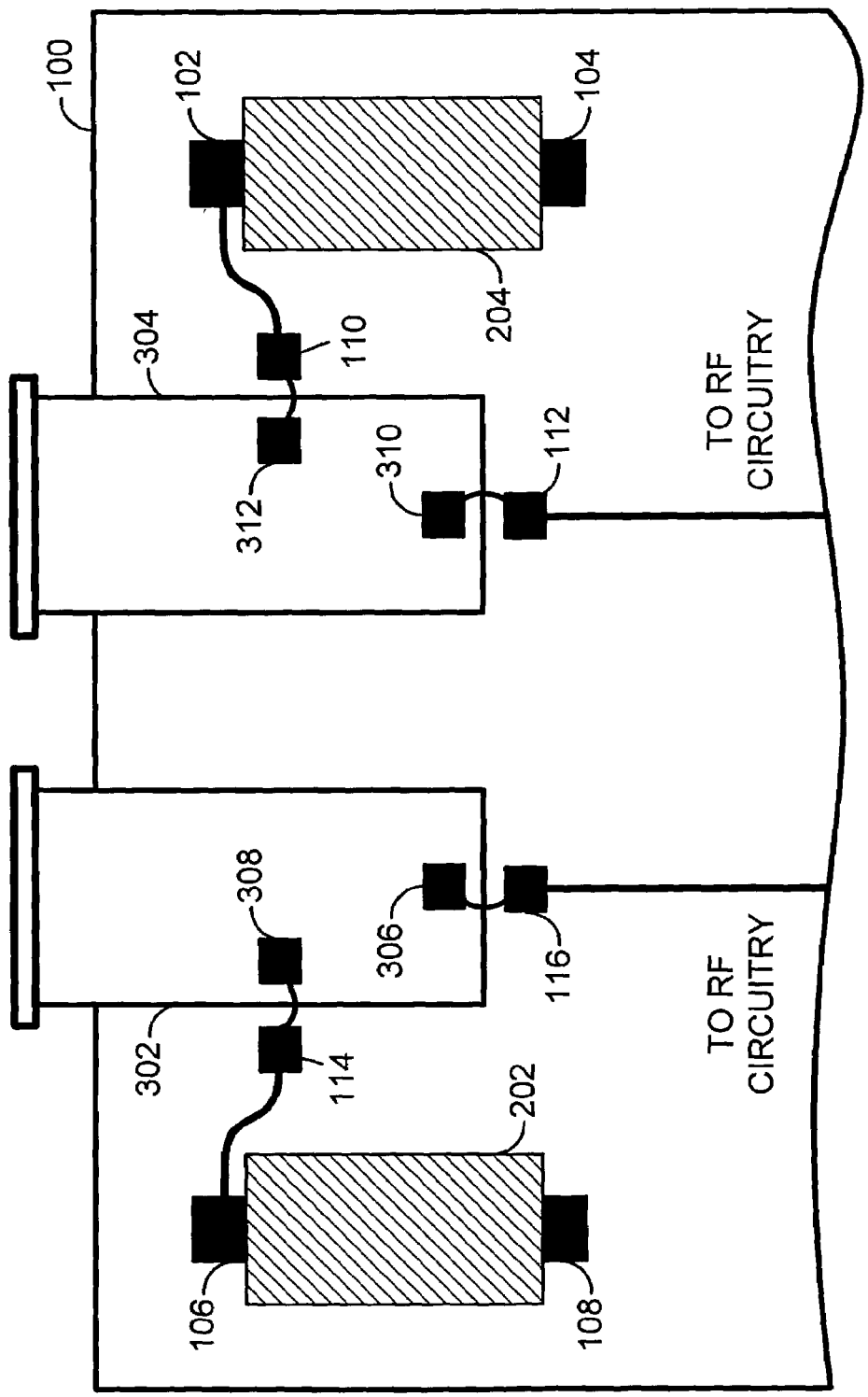
FIG. 4 is a partial diagrammatic view of the PCB of FIG. 1 with both a pair of surface mount antennas and a pair of RF antenna connectors mounted thereon according to the present invention.

FIG. 4 is a partial diagrammatic view of the PCB of FIG. 1 with both a pair of surface mount antennas and a pair of RF antenna connectors mounted thereon according to the present invention. In this construction, both surface mount antennas 202 and 204 and RF antenna connectors 302 and 304 are mounted on the PCB 100. Because the RF antenna connectors 302 and 304 are switched, when they are switched as pass through devices, they form a portion of a circuit between the RF circuitry and the surface mount antennas 202 and 204. However, when they are switched to terminate a connection, they disrupt the circuit between the RF circuitry and the surface mount antennas 202 and 204.

Figure 5:
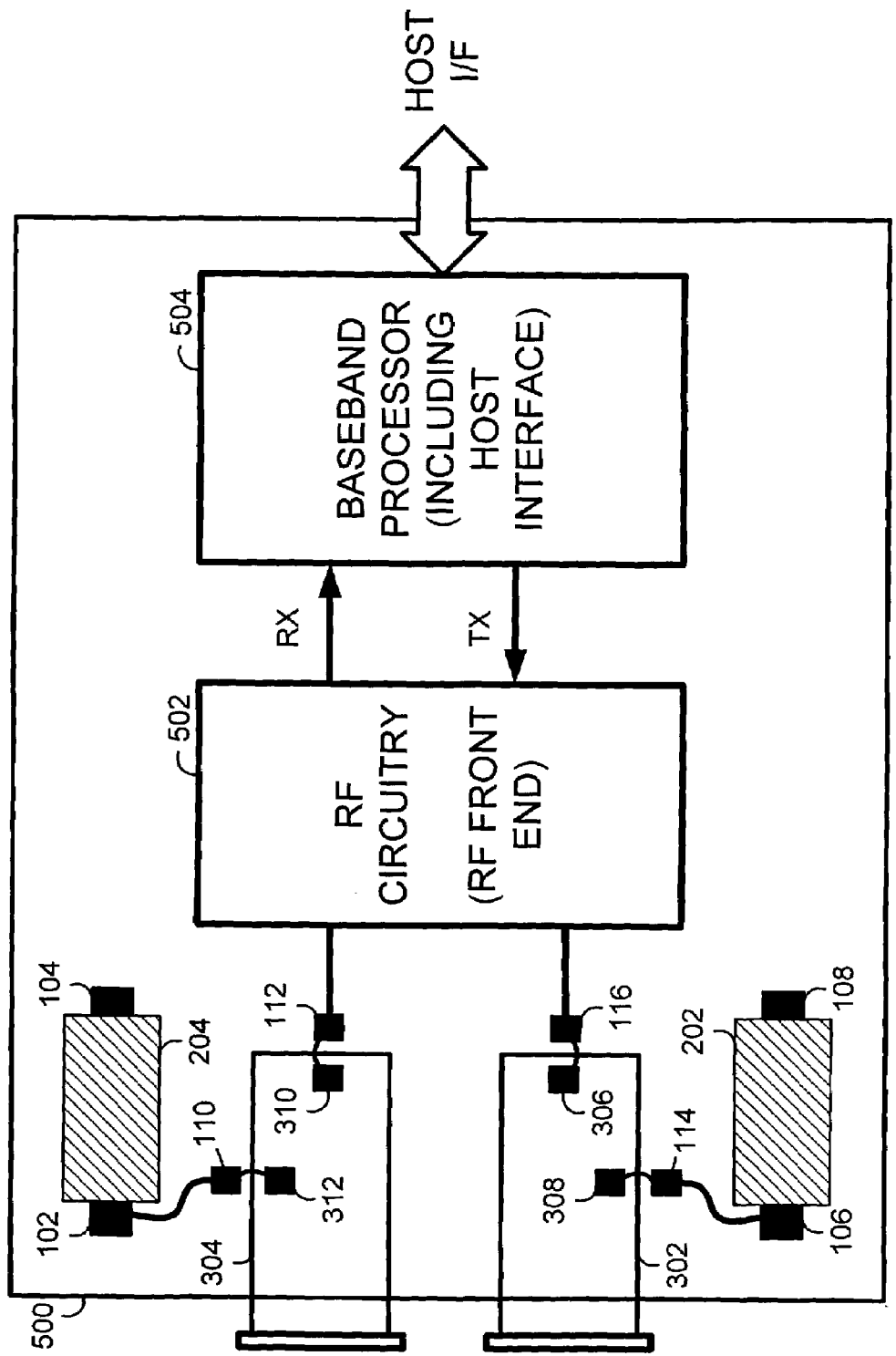
FIG. 5 is a diagrammatic view of the PCB of FIG. 1 with a pair of surface mount antennas, a pair of RF antenna connectors, RF circuitry, and a baseband processor mounted thereon to form a wireless network card according to the present invention.

FIG. 5 is a diagrammatic view of the PCB of FIG. 1 with a pair of surface mount antennas 202 and 204, a pair of RF antenna connectors 302 and 304, RF circuitry 502, and a baseband processor 504 mounted thereon to form a wireless network card 500 according to the present invention. The wireless network card 500 of FIG. 5 has a structure similar to that of the PCB 100 of FIG. 4 except that RF circuitry (RF front end) 502 and a baseband processor 504 (including a host interface) have been mounted thereon. In another embodiment, the RF circuitry 502 and the baseband processor 504 may be contained in a single integrated circuit. In still further embodiments, various other discrete components may also be contained on the PCB.

The wireless network card 500 of FIG. 5 would typically appear in a device used for testing the performance of the wireless network card 500. During such a testing process, some tests would require use of the surface mount antennas 202 and 204 while other of the tests would require use of external antennas coupled to RF antenna connectors 302 and 304. Wireless network cards having internal antennas, such as the configuration of FIG. 2, would typically be installed in wireless network client devices. Alternately, wireless network cards coupled to external antennas, such as the configuration of FIG. 3, would typically be installed in Wireless Access Points (WAPs). Examples of each of these devices are illustrated in FIG. 10.

Figure 6:
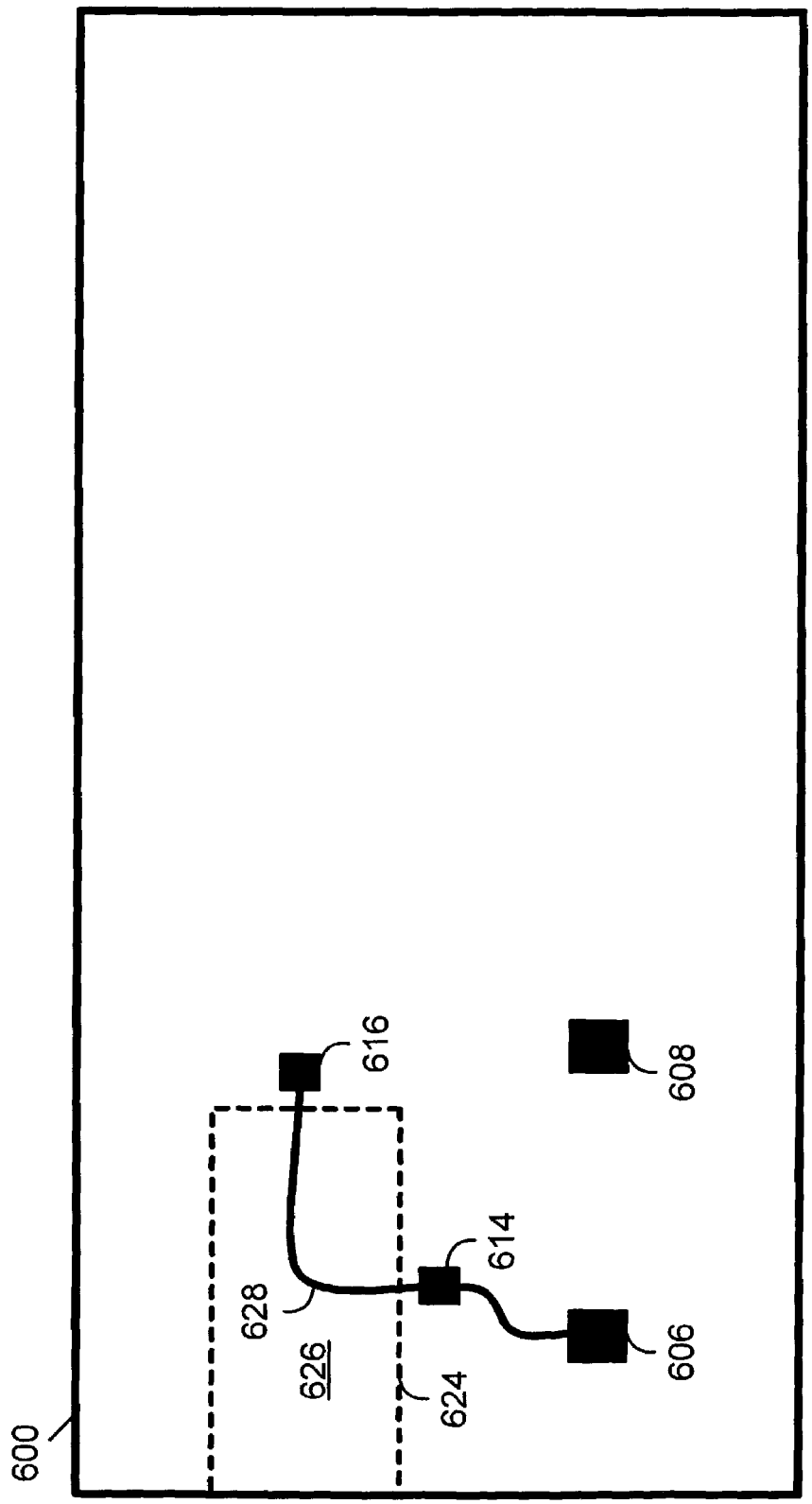
FIG. 6 is a diagrammatic view of another embodiment of a PCB constructed according to the present invention prior to the mounting of electronics.

FIG. 6 is a diagrammatic view of another embodiment of a PCB constructed according to the present invention prior to the mounting of electronics. The PCB 600 is similar to the PCB described with reference to FIG. 1 and is formed in a similar/same manner. When manufactured, the PCB 600 includes connections for an internal antenna. In particular, surface mount antenna conductive pads 606 and 608 are disposed to receive a surface mount antenna. The PCB 600 also includes a removable portion 626 that, when removed, receives an RF antenna connector such as a coaxial or another connector.

Removable portion 626 is defined by a boundary 624. This boundary 624 may be perforations in the PCB 600 that extend substantially or fully through the PCB 600. This boundary 624 may be formed via laser etching, drilling, or another technique that creates the perforations in the PCB 600. In another embodiment, the boundary 624 merely identifies the removable portion 626 through which no conductor other than conductor 628 resides. In such case, the boundary 624 serves as a guideline employed for removal of the removable portion 624 using a saw, drill, laser or another tool that would allow the removable portion 624 of the PCB 600 to be removed.

Figure 10:
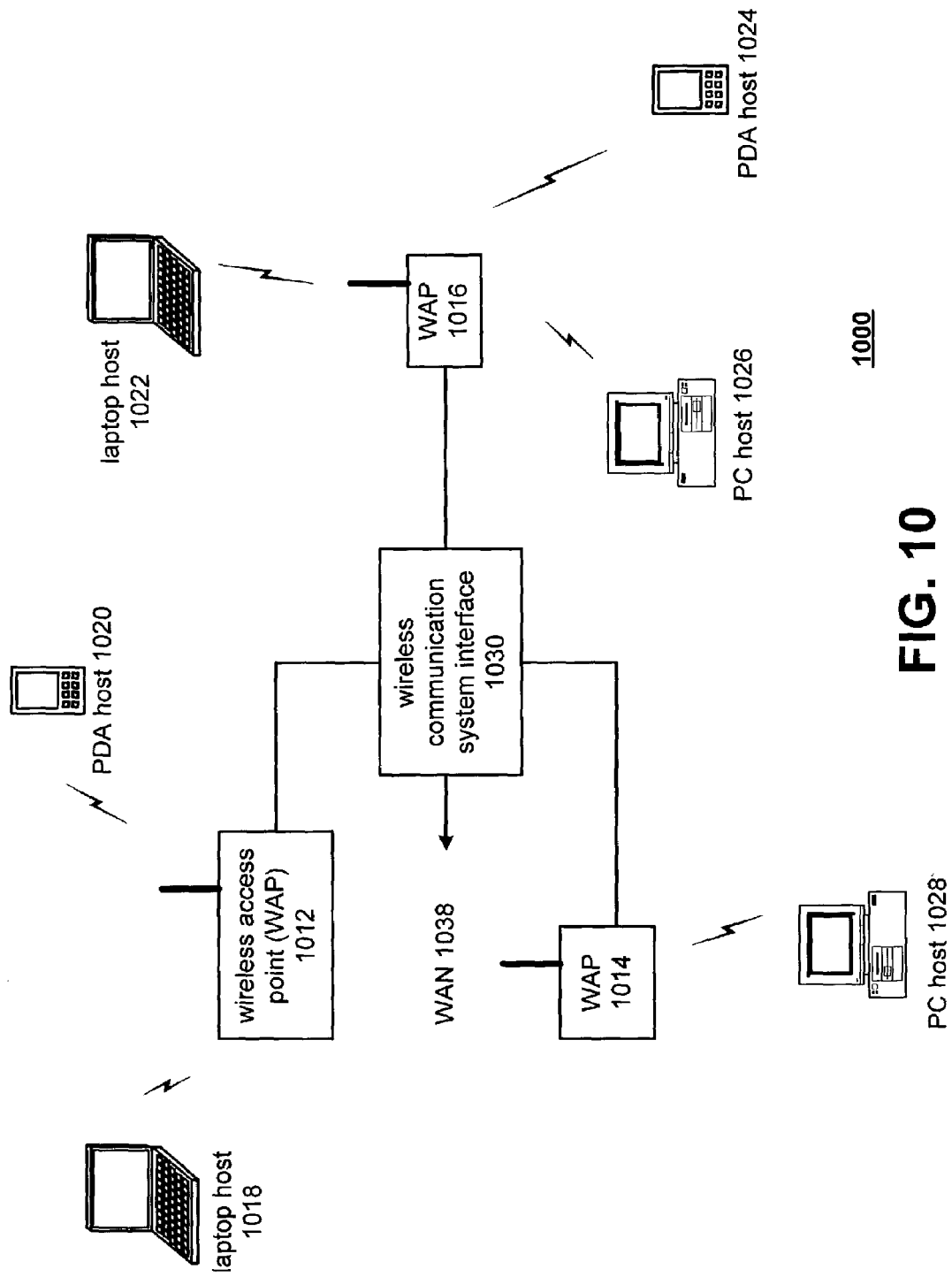
FIG. 10 is a system diagram illustrating a wireless communication system that supports wireless devices that are constructed according to the present invention.

When the PCB 600 is used to create a client wireless network card, e.g., in a client wireless device such as those shown in FIG. 10, an internal antenna is mounted on the PCB and coupled to conductive pads 606 and 608 formed thereon. When the PCB 600 is used to create a WAP wireless network card, the removable portion is removed and an RF antenna connector is installed in the opening previously occupied by the removable portion 626. Then, the RF antenna connector is electrically coupled to the PCB 100 and the RF antenna connector is coupled to an antenna that is mounted on an external portion of the WAP. In a third embodiment, in which the wireless network card is used for testing, both the internal antenna and the RF antenna connector are installed.

Conductive pads 614 and 616 residing adjacent removable portion 626 are joined by conductor (controlled impedance transmission line) 628 that is formed in/on the removable portion 626. With the removable portion 626 in place, the conductor 628 joins the conductive pads 614 and 616. With the connection in place, a circuit is formed between surface mount antenna conductive pad 606 and conductive pad 616 that couples to RF circuitry when it is mounted on the PCB 600. This circuit has a characteristic (surge) impedance that matches the internal surface mount antenna. With the removable portion 626 removed, the conductor 628 that previously joined the adjacent conductive pads 616 and 614 is removed therewith. Thus, the circuit that was previously formed between the surface mount antenna conductive pad 606 and pad 616 is severed. However, a switched RF antenna connector that is placed in the opening previously occupied by the removable portion 626 may be coupled to the adjacent conductive pads 614 and 616 to reform the circuit.

Figure 7:
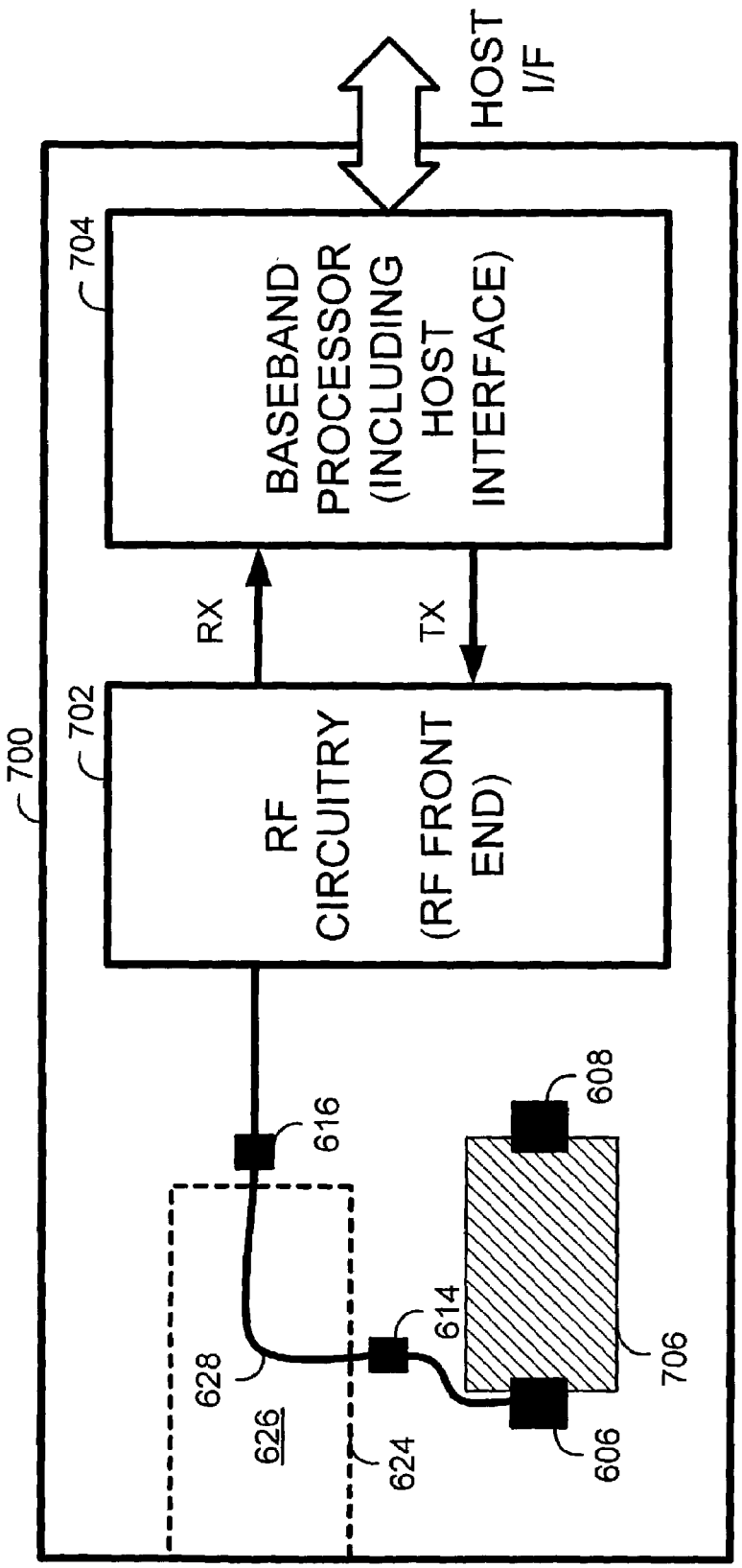
FIG. 7 is a diagrammatic view of the PCB of FIG. 6 with a surface mount antenna, RF circuitry, and a baseband processor mounted thereon to form a wireless network card according to the present invention.

FIG. 7 is a diagrammatic view of the PCB 600 of FIG. 6 with a surface mount antenna 706, RF circuitry 702, and a baseband processor 704 mounted thereon to form a wireless network card 700 according to the present invention. With the embodiment of FIG. 7, the removable portion 626 remains in place such that conductive pads 616 and 614 are still connected by conductor 628. With this impedance-matched circuit in place, the RF circuitry 702 couples to the surface mount internal antenna 702. The wireless network card 700 of FIG. 7 may be used with one of the client wireless network devices of FIG. 10 with which an internal antenna is employed.

Figure 8:
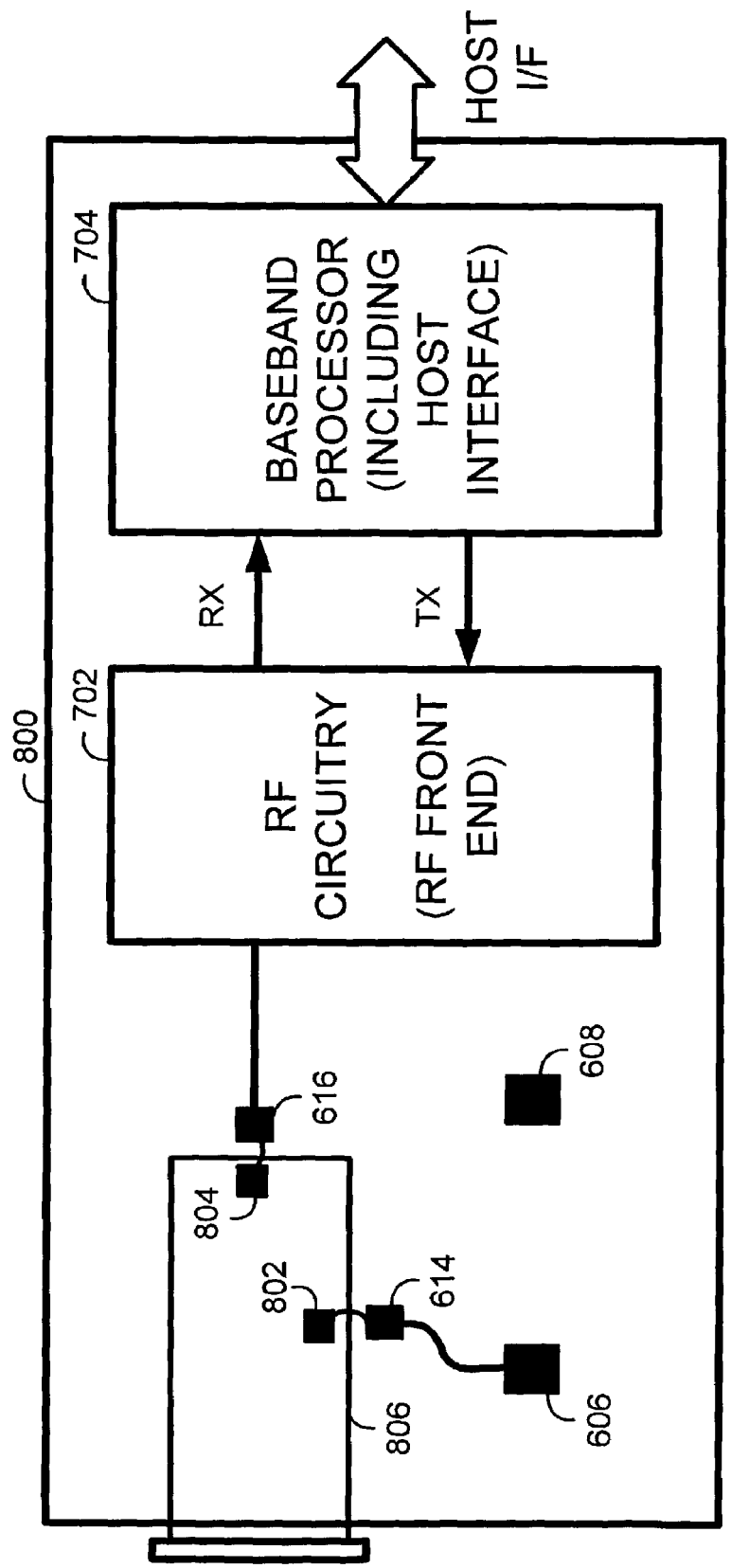
FIG. 8 is a diagrammatic view of the PCB of FIG. 6 with an RF antenna connector, RF circuitry, and a baseband processor mounted thereon to form a wireless network card according to the present invention.

FIG. 8 is a diagrammatic view of the PCB 600 of FIG. 6 with an RF antenna connector 806, RF circuitry 702, and a baseband processor 704 mounted thereon to form a wireless network card 800 according to the present invention. With the embodiment of FIG. 8, the removable portion 626 has been removed and the RF antenna connector 806 has been mounted in the opening. With this configuration, an impedance-matched connection has been made between connector 804 of the RF antenna connector 806 and conductive pad 616 such that the impedance-matched connection couples to the RF circuitry 702. Optionally, connector 802 of the RF antenna connector 806 may be coupled to conductive pad 614. With this impedance-matched circuit in place, the RF circuitry 702 couples to the RF antenna connector 806 that communicatively couples the RF circuitry 702 to an external antenna. The wireless network card 800 of FIG. 8 may be used with one of the WAPs of FIG. 10 with which an external antenna is employed.

Figure 9:
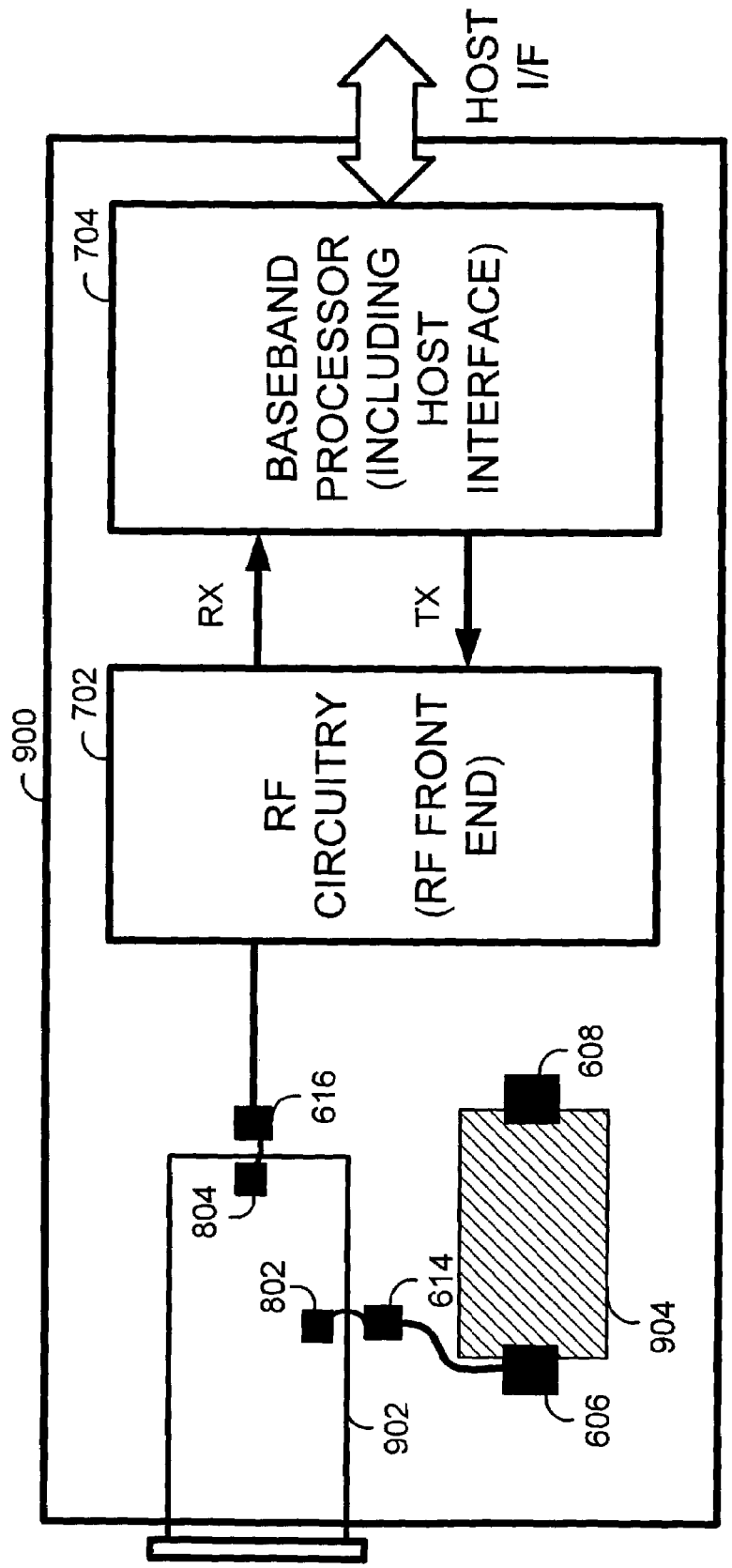
FIG. 9 is a diagrammatic view of the PCB of FIG. 6 with a surface mount antenna, an RF antenna connector, RF circuitry, and a baseband processor mounted thereon to form a wireless network card according to the present invention.

FIG. 9 is a diagrammatic view of the PCB of FIG. 6 with a surface mount antenna 706, an RF antenna connector 806, RF circuitry 702, and a baseband processor 704 mounted thereon to form a wireless network card 900 according to the present invention. With this structure, the RF antenna connector 806 is a switched connector that connects to both conductive pad 614 and conductive pad 616. The wireless network card 900 of FIG. 9 may be used for testing purposes in which alternate configurations, i.e., internal antenna or external antenna, are employed.

Thus, in one operation, the wireless network card 900 operates such that the RF circuitry 702 operates in conjunction with internal antenna 904. In this operation, the RF antenna conductor 806 operates to couple conductive pads 616 and 614. In another operation, the wireless network card 900 operates such that the RF circuitry 702 operates in conjunction with an external antenna coupled via the RF connector 902. In this operation, the RF connector 902 disconnects the internal antenna 904 from the RF circuitry 702.

FIG. 10 is a system diagram illustrating a wireless communication system 100 that supports wireless devices that are constructed according to the present invention. The wireless communication system 1000 includes a plurality of WAPs 1012, 1014, and 1016, a plurality of wireless clients 1018, 1020, 1022, 1024, 1026, and 1028, and a wireless communication system interface 1030 that couples the wireless communication system 1000 to a Wide Area Network 1038. The wireless clients 1018–1028 may be laptop host computers 1018 and 1022, personal digital assistant hosts 1020 and 1024, or personal computer hosts 1026 and 1028. Each of these wireless clients 1018–1028 includes a wireless network card constructed according to the present invention having an internal antenna. Further, each of the WAPs 1012–1016 includes a wireless network card constructed according to the present invention having an RF antenna connector that couples to an external antenna.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

The invention claimed is:

1. A wireless network card comprising:
   a Printed Circuit Board (PCB) that is substantially planar;
   a pair of surface mount antenna conductive pads located on the PCB;
   a removable portion of the PCB that is defined by a boundary;
   a pair of conductive pads formed on the PCB that are located adjacent the removable portion;
   a first controlled impedance transmission line formed on the PCB that provides a connection between the pair of conductive pads, wherein when the removable portion is removed, the connection between the pair of conductive pads is severed; and
   a second controlled impedance transmission line formed on the PCB that couples a first one of the pair of conductive pads to one of the pair of surface mount antenna conductive pads.

2. The wireless network card of claim 1, wherein the removable portion:
   is substantially rectangular shape;
   has a first edge coincident with an edge of the PCB; and
   has second, third, and fourth edges residing within an area of the PCB.

3. The wireless network card of claim 1, wherein when the removable portion has been removed to form the opening, an RF connector has been mounted within the opening.

4. The wireless network card of claim 1, when the removable portion remains, a surface mount antenna is mounted on the PCB and coupled to the pair of surface mount antenna conductive pads.

5. The wireless network card of claim 1, further comprising:
   Radio Frequency (RF) circuitry mounted on the PCB;
   a baseband processor mounted on the PCB and coupled to the RF circuitry; and
   an additional controlled impedance transmission line that couples the RF circuitry to a second one of the pair of conductive pads.

6. The wireless network card of claim 5, wherein when the removable portion is removed to form the opening, an RF connector is mounted within the opening and coupled to the RF circuitry via the second one of the pair of conductive pads.

7. The wireless network card of claim 6, further comprising:
   a surface mount antenna mounted on the PCB and coupled to the pair of surface mount antenna conductive pads;
   a connection between the first one of the pair of conductive pads and the RF connector; and
   wherein the RF connector is switched.

8. The wireless network card of claim 1, wherein:
   Radio Frequency (RF) circuitry mounted on the PCB;

when the removable portion remains, a surface mount antenna is mounted on the PCB between the pair of surface mount antenna conductive pads; and an additional controlled impedance transmission line forms a portion of a connection between the surface mount antenna and the RF circuitry.

9. The wireless network card of claim 1, wherein the pair of surface mount antenna conductive pads, the pair of conductive pads formed on the PCB that are located adjacent the removable portion, the first controlled impedance transmission line formed on the PCB that couple the pair of conductive pads, and the second controlled impedance transmission line formed on the PCB that couples a first one of the pair of conductive pads to one of the pair of surface mount antenna conductive pads are formed on a surface of the PCB.

10. A wireless network card comprising:
a Printed Circuit Board (PCB) that is substantially planar;
a pair of surface mount antenna conductive pads located on the PCB;
a removable portion of the PCB that is defined by a boundary;
a pair of conductive pads formed on the PCB that are located adjacent the removable portion;
a first controlled impedance transmission line formed on the PCB that provides a connection between the pair of conductive pads, wherein when the removable portion is removed, the connection between the pair of conductive pads is severed;
a second controlled impedance transmission line formed on the PCB that couples a first one of the pair of conductive pads to one of the pair of surface mount antenna conductive pads;
Radio Frequency (RF) circuitry mounted on the PCB;
a baseband processor mounted on the PCB and coupled to the RF circuitry; and
an additional controlled impedance transmission line that couples the RF circuitry to a second one of the pair of conductive pads.

11. The wireless network card of claim 10, wherein the removable portion:
is substantially rectangular in shape;
has a first edge coincident with an edge of the PCB; and
has second, third, and fourth edges residing within an area of the PCB.

12. The wireless network card of claim 10, further comprising, when the removable portion remains, a surface mount antenna mounted on the PCB and coupled to the pair of surface mount antenna conductive pads.

13. The wireless network card of claim 10, when the removable portion has been removed to form the opening, the wireless network card further comprises:
an RF connector mounted within the opening; and
a connection between the RF connector and the second one of the pair of conductive pads.

14. The wireless network card of claim 13, further comprising:
a surface mount antenna mounted on the PCB and coupled to the pair of surface mount antenna conductive pads;
a connection between the first one of the pair of conductive pads and the RF connector; and
wherein the RF connector is switched.

15. The wireless network card of claim 10, wherein when the removable portion is removed to form the opening, an RF connector is mounted within the opening and coupled to the RF circuitry.

16. A method for constructing a wireless network card comprising:
constructing a Printed Circuit Board (PCB) that is substantially planar;
forming a pair of surface mount antenna conductive pads on the PCB;
forming a pair of conductive pads on the PCB that are located adjacent a removable portion of the PCB that is defined by a boundary;
forming a first controlled impedance transmission line on the PCB that provides a connection between the pair of conductive pads, wherein when the removable portion is removed, the connection between the pair of conductive pads is severed; and
forming a second controlled impedance transmission line on the PCB that couples a first one of the pair of conductive pads to one of the pair of surface mount antenna conductive pads.

17. The method of claim 16, wherein the removable portion:
is substantially rectangular in shape;
has a first edge coincident with an edge of the PCB; and
has second, third, and fourth edges residing within an area of the PCB.

18. The method of claim 16, further comprising:
removing the removable portion to form the opening;
mounting an RF connector within the opening; and
communicatively coupling the RF connector to a second one of the pair of conductive pads.

19. The method of claim 16, further comprising:
mounting a surface mount antenna on the PCB; and
communicatively coupling the surface mount antenna to the pair of surface mount antenna conductive pads.

20. The method of claim 16, further comprising:
mounting Radio Frequency (RF) circuitry on the PCB;
mounting a baseband processor on the PCB;
communicatively coupling the baseband processor to the RF circuitry; and
communicatively coupling the RF circuitry to a second one of the pair of conductive pads.

21. The method of claim 20, further comprising:
removing the removable portion to form the opening;
mounting an RF connector within the opening; and
coupling the RF connector to the second one of the pair of conductive pads.

22. The method of claim 21, further comprising:
mounting a surface mount antenna on the PCB;
communicatively coupling the surface mount antenna to the pair of surface mount antenna conductive pads;
communicatively coupling the first one of the pair of conductive pads to the RF connector; and
wherein the RE connector is switched.

23. The method of claim 16, wherein the pair of surface mount antenna conductive pads, the pair of conductive pads formed on the PCB that are located adjacent the removable portion, the first controlled impedance transmission line formed on the PCB that couple the pair of conductive pads, and the second controlled impedance transmission line formed on the PCB that couples a first one of the pair of conductive pads to one of the pair of surface mount antenna conductive pads are formed on a surface of the PCB.

24. A method for constructing a wireless network card comprising:
constructing a Printed Circuit Board (PCB) that is substantially planar;
forming a pair of surface mount antenna conductive pads on the PCB;

forming a pair of conductive pads on the PCB that are located adjacent a removable portion of the PCB that is defined by a boundary;

forming a first controlled impedance transmission line on the PCB that provides a connection between the pair of conductive pads, wherein when the removable portion is removed, the connection between the pair of conductive pads is severed;

forming a second controlled impedance transmission line on the PCB that couples a first one of the pair of conductive pads to one of the pair of surface mount antenna conductive pads;

mounting Radio Frequency (RF) circuitry on the PCB;

mounting a baseband processor on the PCB;

communicatively coupling the baseband processor to the RF circuitry;

communicatively coupling the RF circuitry to a second one of the pair of conductive pads;

mounting a surface mount antenna on the PCB; and communicatively coupling the surface mount antenna to the pair of surface mount antenna conductive pads.

25. The method of claim 24, wherein the removable portion:

is substantially rectangular in shape;

has a first edge coincident with an edge of the PCB; and has second, third, and fourth edges residing within an area of the PCB.

26. The method of claim 24, further comprising:

removing the removable portion to form the opening;

mounting an RF connector within the opening; and communicatively coupling the RF connector to a second one of the pair of conductive pads;

communicatively coupling the RF connector to the first one of the pair of conductive pads; and wherein the RF connector is switched.

27. A method for constructing a wireless network card comprising:

constructing a Printed Circuit Board (PCB) that is substantially planar;

forming a pair of surface mount antenna conductive pads on the PCB;

forming a pair of conductive pads on the POB that are located adjacent a removable portion of the PCB that is defined by a boundary;

forming a first controlled impedance transmission line on the PCB that provides a connection between the pair of conductive pads, wherein when the removable portion is removed, the connection between the pair of conductive pads is severed;

forming a second controlled impedance transmission line on the PCB that couples a first one of the pair of conductive pads to one of the pair of surface mount antenna conductive pads;

mounting Radio Frequency (RF) circuitry on the PCB;

mounting a baseband processor on the PCB;

communicatively coupling the baseband processor to the RF circuitry;

communicatively coupling the RF circuitry to a second one of the pair of conductive pads;

removing the removable portion to form the opening;

mounting an RF connector within the opening; and communicatively coupling the RF connector to a second one of the pair of conductive pads.

28. The method of claim 27 wherein the removable portion:

is substantially rectangular in shape;

has a first edge coincident with an edge of the PCB; and has second, third, and fourth edges residing within an area of the PCB.

* * * * *